(12) United States Patent
Lee

(10) Patent No.: US 7,348,676 B2
(45) Date of Patent: Mar. 25, 2008

(54) SEMICONDUCTOR DEVICE HAVING A METAL WIRING STRUCTURE

(75) Inventor: Seong-Soo Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 86 days.

(21) Appl. No.: 11/149,600

(22) Filed: Jun. 9, 2005

(65) Prior Publication Data

US 2005/0287803 A1 Dec. 29, 2005

(30) Foreign Application Priority Data

Jun. 28, 2004 (KR) .................... 10-2004-0049076

(51) Int. Cl.
*H01L 23/48* (2006.01)
(52) U.S. Cl. .................. 257/774; 257/751; 257/752; 257/E21.583; 257/E21.584
(58) Field of Classification Search ........... 257/774, 257/751, 763–767; 438/637, 672–673, 618–600
See application file for complete search history.

(56) References Cited

U.S. PATENT DOCUMENTS

| | | | | |
|---|---|---|---|---|
| 5,300,455 A | * | 4/1994 | Vuillermoz et al. | 438/653 |
| 5,451,551 A | * | 9/1995 | Krishnan et al. | 438/626 |
| 5,637,924 A | * | 6/1997 | Hibino | 257/751 |
| 5,689,140 A | * | 11/1997 | Shoda | 257/774 |
| 6,028,362 A | * | 2/2000 | Omura | 257/774 |

| | | | |
|---|---|---|---|
| 2001/0004140 A1 | | 6/2001 | An et al. |

FOREIGN PATENT DOCUMENTS

| | | |
|---|---|---|
| JP | 08-031935 | 2/1996 |
| JP | 2004-014543 | 1/2004 |
| KR | 2000-0021230 | 4/2000 |
| KR | 2004-0043219 | 5/2004 |

OTHER PUBLICATIONS

English language abstract of Korea Publication No. 2004-0043219.
English language abstract of Japanese Publication No. 08-031935.
English language abstract of the Korean Publication No. 2000-0021230.
English language abstract of the Japanese Publication No. 2004-014543.

* cited by examiner

*Primary Examiner*—Dung A. Le
(74) *Attorney, Agent, or Firm*—Marger Johnson & McCollom, P.C.

(57) ABSTRACT

After an insulation layer is formed on a substrate, a contact hole is formed through the insulation layer. A recessed plug is formed to partially fill up the contact hole. The recessed plug has a height substantially smaller than a depth of the contact hole. A metal wiring structure is formed on the recessed plug and on the insulation layer. A lower portion of the metal wiring structure, formed within the contact hole, prevents damage to the recessed plug during an etching process for forming the metal wiring structure. Therefore, the recessed plug may be formed without damage thereof even if an alignment error occurs between an etching mask and the recessed plug during metal wiring structure formation.

15 Claims, 13 Drawing Sheets

__US 7,348,676 B2__

SEMICONDUCTOR DEVICE HAVING A METAL WIRING STRUCTURE

CROSS REFERENCE TO RELATED APPLICATION

This application claims priority under 35 USC § 119 to Korean Patent Application No. 2004-49076 filed on Jun. 28, 2004, the contents of which are herein incorporated by reference in its entirety.

BACKGROUND OF THE INVENTION

1. Field of the Invention

The present invention relates to a semiconductor device having a metal wiring structure and a method of manufacturing the semiconductor device including the metal wiring structure. More particularly, the present invention relates to a semiconductor device including a metal wiring structure electrically connected to a plug and a method of manufacturing the semiconductor device having the metal wiring structure.

2. Description of the Related Art

To meet varied demands, semiconductor devices have been developed that exhibit high response speeds, high reliabilities, high integration degrees, etc. To improve the response speed of the semiconductor device, memory cells are integrated on one chip to thereby reduce the design rule of the semiconductor devices. Accordingly, conductive wirings of more modern semiconductor devices typically have multi-layer, three-dimensional structures.

In such semiconductor devices, a contact or a plug is generally provided so as to connect one layer of conductive wiring to another layer of conductive wiring or electrically connect between conductive wiring regions of a substrate. Thus, the contact or the plug reduces a contact resistance between conductive wirings or between conductive wiring and the substrate. The contact or the plug typically includes a barrier layer and a conductive layer. The conductive layer may include doped polysilicon or a metal such as tungsten (W). The conductive wiring of metal is formed on the contact or the plug so that the conductive wiring is electrically connected to a lower conductive wiring or a contact region of a substrate.

FIG. 1 is a block diagram illustrating a conventional method of forming a metal wiring electrically connected to a contact plug, and FIG. 2 is a cross sectional view illustrating a semiconductor device including the metal wiring formed in the process of FIG. 1.

Referring to FIGS. 1 and 2, after an insulation layer 14 is formed on a substrate 10, the insulation layer 14 is partially etched to form contact holes that expose a gate electrode (not shown) and a portion of substrate 10, respectively in step S10.

In step S20, a cleaning process is performed, and then barrier layers 16 are formed on the gate electrode, the exposed portion of the substrate 10 and sidewalls of the contact holes.

After a polysilicon layer is formed on the barrier layers 16 to fill up the contact holes, the polysilicon layer is partially removed by a chemical mechanical polishing (CMP) process to thereby form plugs 18 in the contact holes in step S30.

In step S40, a tungsten layer is formed on plugs 18 and the insulation layer 14, and then an etching mask is formed on the tungsten layer. In step S50, the tungsten layer is etched by a dry etching process using the etching mask so that tungsten wirings 20 are formed on the full-height plugs 18, respectively.

Below design rules of about 13 μm, however, the plug 18 has an area substantially identical to that of metal wiring 20. Any alignment error of an etching mask relative to the plug 18 during formation of the metal wiring can reduce the effectiveness of the semiconductor device. That is, when the etching mask is incorrectly positioned with respect to the plug 18, the plug 18 may be damaged in the etching process for forming the metal wiring, thereby generating a recess D as shown in FIG. 2. The recess D is typically generated due to an etching rate difference between the plug 18 and the metal wiring during the etching process.

When the recess D is formed on the plugs 18, a contact failure between the plug 18 and the metal wiring may occur, thereby deteriorating the electrical characteristics of a semiconductor device between the plugs 18 and the metal wiring.

SUMMARY OF THE INVENTION

The present invention provides a semiconductor device having a metal wiring structure and a recessed plug while preventing contact failure.

The present invention also provides a method of manufacturing a semiconductor device including a metal wiring structure and a recessed plug without damage to the recessed plug.

In accordance with one aspect of the present invention, there is provided a semiconductor device including an insulation layer having a contact hole formed on a substrate, a recessed contact plug, and a metal wiring structure. The contact hole exposes a portion of the substrate. The recessed contact plug partially fills up the contact hole, and has a height substantially smaller than a depth of the contact hole. For example, the height of the recessed plug is about 4/5 to about 9/10 of the depth of the contact hole. The metal wiring structure includes a lower metal wiring making contact with the recessed plug, and an upper metal wiring formed on the lower metal wiring. The lower metal wiring is formed on the recessed contact plug to completely fill up the contact hole. The upper metal wiring may make partial contact with the lower metal wiring.

In an exemplary embodiment of the present invention, the semiconductor device may further include a conductive structure including a gate electrode formed on the substrate and source/drain regions formed adjacent to the gate electrode.

In an exemplary embodiment of the present invention, the conductive structure may additionally include metal silicide layer patterns formed on the gate electrode and the source/drain regions, respectively.

In an exemplary embodiment of the present invention, the semiconductor device may additionally include a barrier layer pattern formed between the recessed plug and a sidewall of the contact hole and between the recessed plug and the exposed portion of the substrate.

In accordance with another aspect of the present invention, there is provided a semiconductor device including a first conductive structure, a second conductive structure, an insulation layer having a first contact hole and a second contact hole, a recessed contact plug, a first metal wiring structure and a second metal wiring structure. The first and the conductive structures are formed on a substrate. The first contact hole exposes the first conductive structure, and the second contact hole exposes the second conductive structure. The recessed contact plug partially fills up the first contact hole. The recessed contact plug has a height substantially smaller than a depth of the first contact hole. The first metal wiring structure is formed on the insulation layer to make contact with the recessed plug, and the second metal wiring structure is formed on the insulation layer to make contact with the second conductive structure.

In an exemplary embodiment of the present invention, the first conductive structure includes source/drain regions and a first metal silicide layer pattern formed on the source/drain regions, and the second conductive structure includes a gate electrode and a second metal silicide layer pattern formed on the gate electrode.

In an exemplary embodiment of the present invention, the semiconductor device may further include a first barrier layer pattern formed between the recessed plug and a sidewall of the first contact hole, and between the recessed plug and the first conductive structure, and a second barrier layer pattern formed between the second metal wiring structure and a sidewall of the second contact hole and between the second metal wiring structure and the second conductive structure.

In accordance with still another aspect of the present invention, there is provided a method of manufacturing a semiconductor device. In the method, an insulation layer is formed on a substrate. The insulation layer has a contact hole exposing a portion of the substrate. A recessed plug is formed through the insulation layer to partially fill up the contact hole. A metal wiring structure is formed on the recessed plug and on the insulation layer.

In an exemplary embodiment of the present invention, a conductive structure is additionally formed on the substrate before forming the insulation layer. The conductive structure has a gate electrode formed on the substrate and source/drain regions formed adjacent to the gate electrode.

In an exemplary embodiment of the present invention, a barrier layer pattern is further formed between the recessed plug and a sidewall of the contact hole, and between the recessed plug and the exposed portion of the substrate.

In an exemplary embodiment of the present invention, the recessed plug is formed by forming a conductive layer on the insulation layer to fill up the contact hole, forming a preliminary plug in the contact hole by partially removing the conductive layer positioned on the insulation layer, and forming the recessed plug by partially removing the preliminary plug positioned in the contact hole. The preliminary plug may be partially removed by an etch back process. Here, a removed portion of the preliminary plug is in a range of about 1/10 to about 1/5 of an entire height of the preliminary plug.

In an exemplary embodiment of the present invention, the metal wiring structure is formed by forming a metal layer on the insulation layer to completely fill up the contact hole, and etching the metal layer to form a lower metal wiring on the recessed plug and an upper metal wiring on the lower metal wiring.

In accordance with still another aspect of the present invention, there is provided a method of manufacturing a semiconductor device. In the method, a first conductive structure and a second conductive structure are formed on a substrate. An insulation layer is formed on the substrate to cover the first and second conductive structures. A first contact hole exposing the first conductive structure is formed through the insulation layer by partially etching the insulation layer. A recessed plug is formed to partially fill up the first contact hole. A second contact hole exposing the second conductive structure is formed through the insulation layer by partially etching the insulation layer. A first metal wiring structure is formed on the recessed plug and on the insulation layer, and a second metal wiring structure filling up the second contact hole is formed on the insulation layer.

In an exemplary embodiment of the present invention, a first barrier layer pattern is formed between the recessed plug and a sidewall of the first contact hole, and between the recessed plug and the first conductive structure. Additionally, a second barrier layer pattern is formed between the second metal wiring structure and a sidewall of the second contact hole, and between the second metal wiring structure and the second conductive structure.

In an exemplary embodiment of the present invention, the first and second metal wiring structures are simultaneously formed. In a process for forming the first and second metal wiring structures, a metal layer is formed on the insulation layer to completely fill up the first contact hole and the second contact hole. Then, the metal layer is etched to form the first metal wiring structure including a first lower metal wiring formed on the recessed plug and a first upper metal wiring on the first lower metal wiring, and to form the second metal wiring including a second lower metal wiring filling up the second contact hole and a second upper metal wiring formed on the second lower metal wiring.

In accordance with still another aspect of the present invention, there is provided a method of manufacturing a semiconductor device. In the method, an insulation layer is formed on a substrate having a first conductive structure and a second conductive structure. A first contact hole and a second contact hole are formed through the insulation layer by partially etching the insulation layer. The first and second contact holes expose the first and second conductive structures, respectively. A first recessed plug and a second recessed plug are formed in the first contact hole and the second contact hole, respectively. A first metal wiring structure and a second metal wiring structure are formed on the first recessed plug and the second recessed plug, respectively.

In an exemplary embodiment of the present invention, a first barrier layer pattern is formed between the first recessed plug and a sidewall of the first contact hole, and between the first recessed plug and the first conductive structure. Additionally, a second barrier layer pattern is formed between the second recessed plug and a sidewall of the second contact hole, and between the second recessed plug and the second conductive structure.

In an exemplary embodiment of the present invention, the first and second recessed plugs are formed by forming a conductive layer on the insulation layer to fill up the first and second contact holes, by forming a first preliminary plug in the first contact hole and a second preliminary plug in the second contact hole by partially removing the conductive layer positioned on the insulation layer, and by forming the first and second recessed plugs by partially removing the first and second preliminary plugs positioned in the first and second contact holes.

According to the present invention, a recessed plug is formed in a contact hole by partially etching a preliminary plug, and then a metal wiring structure is formed on the recessed plug. A lower portion of the metal wiring structure prevents damage to the recessed plug during an etching process for forming the metal wiring structure. Therefore, the recessed plug may be formed without damage thereof even if there is an alignment error between an etching mask and the recessed plug in the etching process for forming the metal wiring structure. As a result, a contact failure of the metal wiring structure relative to the recessed plug is avoided.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION OF THE INVENTION

Figure 1:
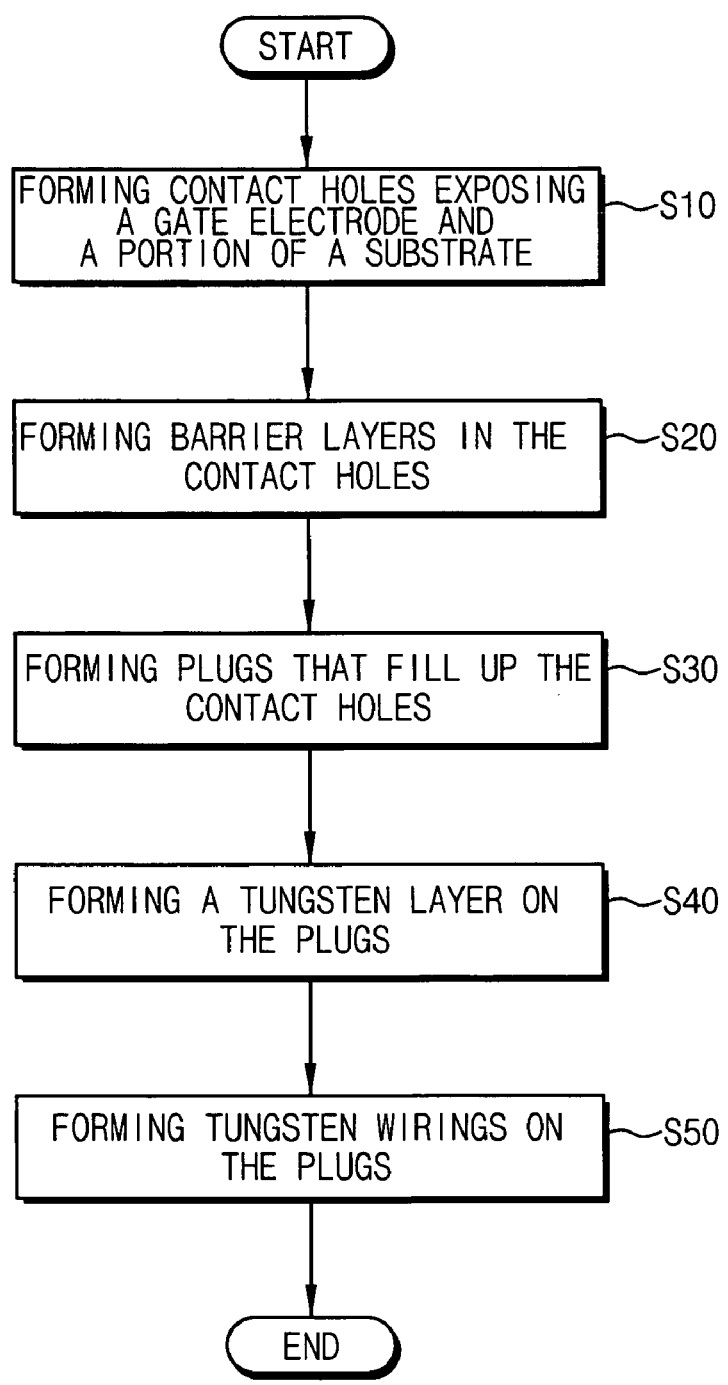
FIG. 1 is a block diagram illustrating a conventional method of forming a metal wiring electrically connected to a contact plug.
Figure 2:
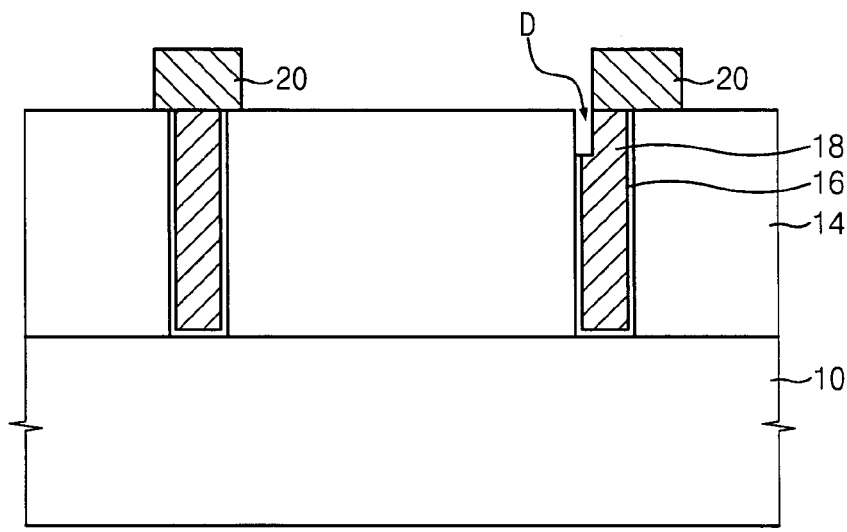
FIG. 2 is a cross sectional view illustrating a semiconductor device including the metal wiring in FIG. 1.

The present invention now will be described more fully hereinafter with reference to the accompanying drawings, in which exemplary embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like reference numerals refer to similar or identical elements throughout. It will be understood that when an element such as a layer, region or wafer is referred to as being "on" or "onto" another element, it can be directly on the other element or intervening elements may also be present.

Figure 3:
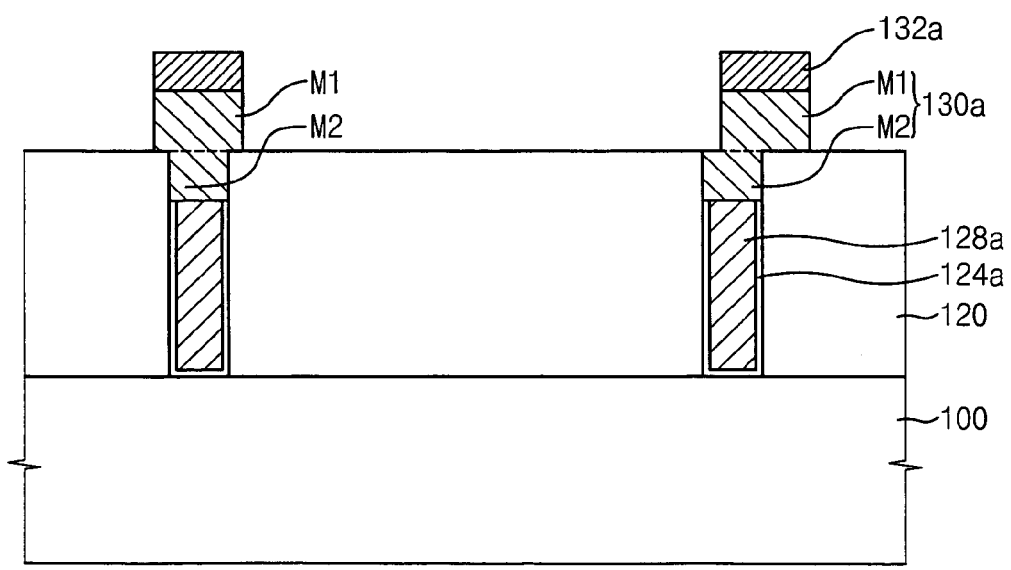
FIG. 3 is a cross sectional view illustrating a semiconductor device including a metal wiring structure electrically connected to a plug in accordance with an exemplary embodiment of the present invention.

FIG. 3 is a cross sectional view illustrating a semiconductor device including a metal wiring structure and a plug in accordance with an exemplary embodiment of the present invention.

Referring to FIG. 3, the semiconductor device includes a substrate 100, an insulation layer 120 having a contact hole that exposes a portion of the substrate 100, a recessed plug 128a formed in the contact hole, a barrier layer pattern 124a formed between the recessed plug 128a and a sidewall of the contact hole, and a metal wiring structure 130a contacting the recessed plug 128a.

The substrate 100 may include a silicon wafer. An isolation layer (not shown) is formed on the substrate 100 to define an active region and a field region of the substrate 100. The isolation layer may be formed using a shallow trench isolation (STI) process. A conductive structure such as a transistor (not shown) including a gate electrode, source/drain regions, and a spacer may be formed on the substrate 100. The conductive structure may further include metal silicide layer patterns formed on the gate electrode and the source/drain regions, respectively.

The insulation layer 120 may be formed on the substrate 100 by a chemical vapor deposition (CVD) process, a plasma enhanced chemical vapor deposition (PECVD) process, high density plasma chemical vapor deposition (HDP-CVD) process, etc. The insulation layer 120 may include an oxide such as boro-phosphor silicate glass (BPSG), undoped silicate glass (USG), spin on glass (SOG), etc.

The contact hole is formed through the insulation layer 120 by partially etching the insulation layer. The contact hole may expose a predetermined portion of the substrate 100 such as a contact region and/or the gate electrode of the transistor.

The barrier layer pattern 124a is uniformly formed on the sidewall of the contact hole. The barrier layer pattern 124a is positioned between the plug 128a and the exposed portion of the substrate 100. Additionally, the barrier layer pattern 124a is formed between the plug 128a and the gate electrode of the transistor. The barrier layer pattern 124a is adapted to prevent the conductive material contained in the plug 128a from diffusing into the substrate 100 and/or the insulation layer 120. The barrier layer pattern 128a is adapted to also improve adhesiveness between the plug 128a and the substrate 100 or between the plug 128a and the gate electrode. Furthermore, the barrier layer pattern 128a is adapted to reduce a contact resistance between the plug 128a and the substrate 100 or between the plug 128a and the gate electrode.

The recessed plug 128a has a height substantially lower than a depth of the contact hole or a height of the insulation layer 120. That is, the recessed plug 128a partially fills up the contact hole. In a preferred embodiment, for instance, the height of the recessed plug 128a may be about 4/5 to about 9/10 of the depth of the contact hole or the height of the insulation layer 120. The recessed plug 128a is formed in the contact hole by partially etching a preliminary plug after completely filling up the contact hole with the preliminary plug. When the recessed plug 128a is formed in the contact hole, a recess is generated at an upper portion of the contact hole.

The metal wiring structure 130a includes a lower metal wiring M2 and an upper metal wiring M1. The lower metal wiring M2 fills up the recess of the contact hole, and the upper metal wiring M1 exists on the lower metal wiring M2 and the insulation layer 120. The lower metal wiring M2 completely fills up the contact hole and makes contact with the recessed plug 128a. The upper wiring M1 is formed on the lower metal wiring M2 and on the insulation layer 120 so that the upper wiring M1 makes partial or offset contact with the lower wiring M2. The metal wiring structure 130a may include a metal such as tungsten, aluminum, copper, etc. In one example, the metal wiring structure 130a corresponds to a bit line of a semiconductor device.

In a semiconductor device having the metal wiring structure 130a, since the recessed plug 128a is not exposed in an etching process for forming the metal wiring structure 130a, the recessed plug 128a would not be damaged in the etching process for forming the metal wiring structure 130a even if an alignment error of an etching mask 132a relative to the recessed plug 128a occurs during the etching process. This prevents contact failures between the recessed plug 128a and the metal wiring structure 130a may be prevented to thereby improve electrical characteristics of semiconductor device including metal wiring structures 130a.

Figure 4:
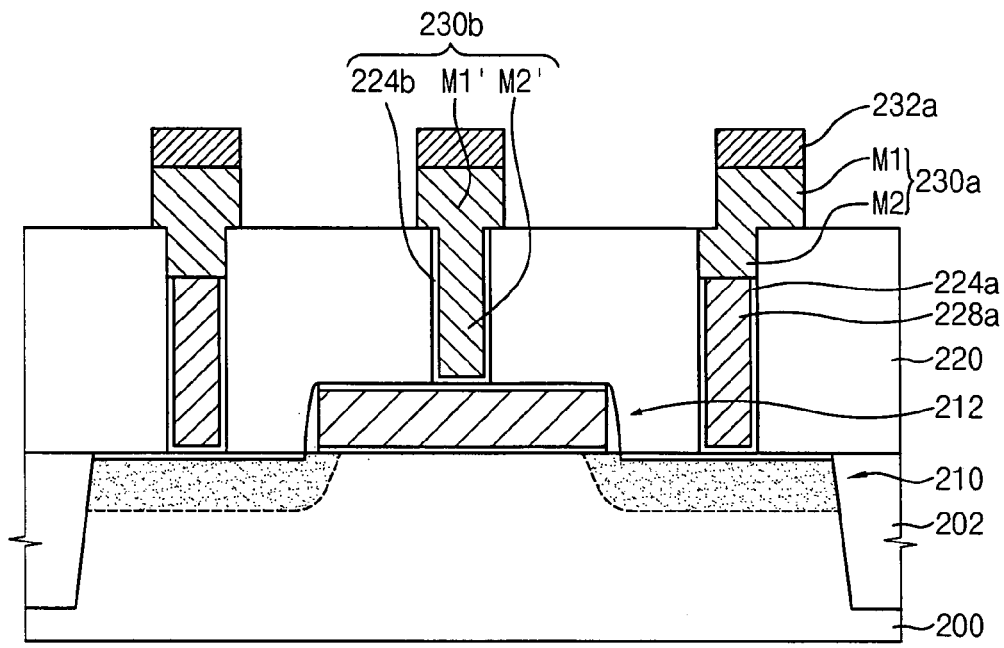
FIG. 4 is a cross sectional view illustrating a semiconductor device including metal wiring structures in accordance with an exemplary embodiment of the present invention.

FIG. 4 is a cross sectional view illustrating a semiconductor device including metal wiring structures in accordance with an exemplary embodiment of the present invention.

Referring to FIG. 4, the semiconductor device includes a first conductive structure 210, a second conductive structure 212, an insulation layer 220 having a first contact hole and a second contact hole, a recessed plug 228a, a first metal wiring structure 230a, and a second metal wiring structure 230b.

An isolation layer 202 is formed on the substrate 200 to define an active region and a field region on the substrate 200. The isolation layer 202 may be formed in an isolation process such as an STI process.

The first and second conductive structures 210 and 212 are formed in the active region of the substrate 200. The first conductive structure 210 may include source/drain regions formed on the substrate 200 adjacent to the second conductive structure 212. The first conductive structure 210 may further include a first metal silicide pattern formed on the source/drain regions. The second conductive structure 212 includes a gate insulation layer formed on the substrate 200, a gate electrode formed on the gate insulation layer, and a spacer formed on a sidewall of the gate electrode. The second conductive structure 212 may additionally include a second metal silicide pattern formed on the gate electrode.

The insulation layer 220 is formed on the substrate 200 to cover the first and second conductive structures 210 and 212. The insulation layer 220 may include an oxide such as BPSG, USG, SOG, HDP-CVD oxide. The first the second contact holes are formed through the insulation layer 220 to expose the first and second conductive structures 210 and 212, respectively. For example, the first contact hole exposes the source/drain region of the first conductive structure 210, and the second contact hole exposes the gate electrode of the second conductive structure 212.

The semiconductor device further includes a first barrier layer pattern 224a and a second barrier layer pattern 224b. The first barrier layer pattern 224a is uniformly formed between the recessed plug 228a and a sidewall of the first contact hole, and between the recessed plug 228a and the first conductive structure 210. The first barrier layer pattern 224a prevents the conductive material contained in the recessed plug 228a from diffusing into the first conductive structure 210 and the insulation layer 220. The first barrier layer pattern 224a additionally improves adhesiveness between the recessed plug 228a and the first conductive structure 210, and between the recessed plug 228a and the insulation layer 220. Furthermore, the first barrier layer pattern 224a reduces a contact resistance between the recessed plug 228a and the first conductive structure 210. The second barrier layer pattern 224b is uniformly formed between the second metal wiring structure 230b and a sidewall of the second contact hole, and between the second metal wiring structure 230b and the second conductive structure 212. The second barrier layer pattern 224b also prevents the conductive material contained in the second metal wiring structure 230b from diffusing into the second conductive structure 212 and the insulation layer 220. The second barrier layer pattern 224b additionally improves adhesiveness between the second metal wiring structure 230b and the second conductive structure 212, and between the second metal wiring structure 230b and the insulation layer 220. Moreover, the second barrier layer pattern 224b reduces a contact resistance between the second metal wiring structure 230b and the second conductive structure 212.

The recessed plug 228a is formed in the first contact hole and is electrically connected to the first conductive structure 210. The recessed plug 228a has a height substantially smaller than a depth of the first contact hole or a height of the insulation layer 220. That is, the recessed plug 228a partially fills up the first contact hole. For example, the recessed plug 228a has a height that is only about ⅘ to about 9/10 of the depth of the first contact hole or a height of the insulation layer 220. The recessed plug 228a is formed in the first contact hole by partially etching a conductive layer filling up the first contact hole. When the recessed plug 228a is formed in the first contact hole, the first contact hole has a recess at an upper portion thereof—that is, a top surface of the recess is below the top surface of the insulation layer.

The first metal wiring structure 230a is formed on the recessed plug 228a and the insulation layer 220 to completely fill up the recess of the first contact hole. The first metal wiring structure 230a includes a first lower metal wiring M2 and a first upper metal wiring M1. The first lower metal wiring M2 is positioned on the recessed plug 228a to completely fill up the recess of the first contact hole. The first upper metal wiring M1 is formed on the first lower metal wiring M2 and the insulation layer 220. Here, the first upper metal wiring M1 may make partially contact with the first lower metal wiring M2. That is, the first upper metal wiring M1 is alternately positioned on the first lower metal wiring M2 so that a wire center is offset relative to the center of the plug 228a. The first metal wiring structure 230a may include a metal such as tungsten, aluminum, copper, etc.

The second metal wiring structure 230b is formed on the second conductive structure 212 and insulation layer 220 to fill up the second contact hole. The second metal wiring structure 230b includes a second lower metal wiring M2' filling up the second contact hole, and a second upper metal wiring M1' formed on the second metal wiring M2'. The second lower metal wiring M2' is electrically connected to the second conductive structure 212. The second metal wiring structure 230b may also include a metal such as tungsten, aluminum, copper, etc.

According to the semiconductor device having the first and second metal wiring structures 230a and 230b, since the recessed plug 228a is not exposed in an etching process for forming the first and second metal wiring structures 230a and 230b, the recessed plug 228a may not be damaged in the etching process for forming the first and second metal wiring structures 230a and 230b although an alignment error of an etching mask 232a relative to the recessed plug 228a may occur in the etching process. Therefore, a contact failure between the recessed plug 228a and the first metal wiring structure 230a would be prevented, thereby improving the electrical characteristics of the semiconductor device including the first and second metal wiring structures 230a and 230b.

FIGS. 5 to 11 are cross sectional views illustrating a method of manufacturing a semiconductor device including a metal wiring structure and a plug in accordance with an exemplary embodiment of the present invention.

Figure 5:
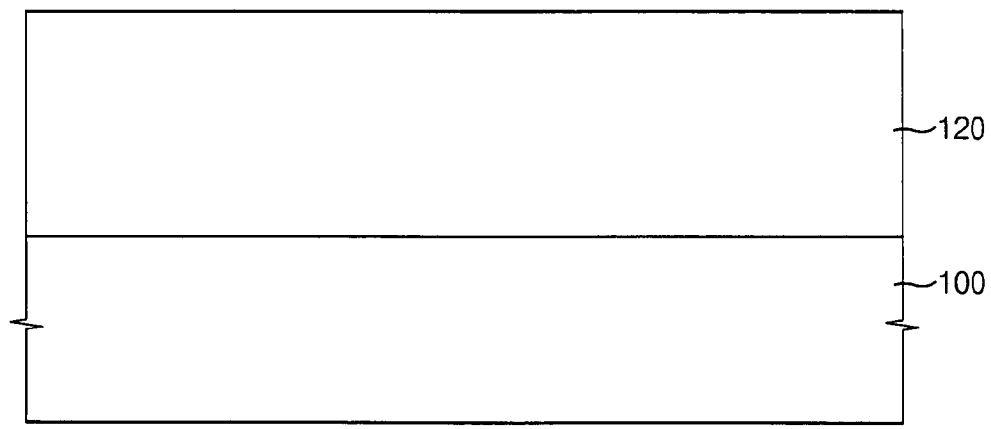
FIGS. 5 to 11 are cross sectional views illustrating a method of manufacturing a semiconductor device including a metal wiring structure and a plug in accordance with an exemplary embodiment of the present invention.

Referring to FIG. 5, after an isolation layer (not shown) is formed on a semiconductor substrate 100, an insulation layer 120 is formed on the substrate 100 such as a silicon wafer. When the isolation layer is formed on the substrate 100 by an isolation process such as STI process, an active region and a field region are defined on the substrate 100. Here, a conductive structure including a gate electrode, a spacer, source/drain regions, etc. may be formed on the substrate 100. The conductive structure may additionally include metal silicide layer patterns formed on the gate electrode and the source/drain regions, respectively.

Figure 6:
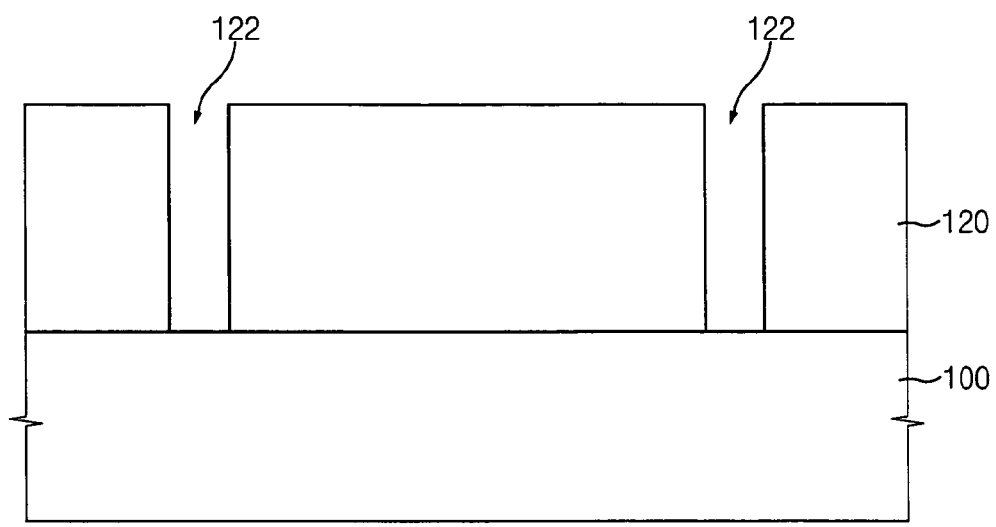

Referring to FIG. 6, the insulation layer 120 is partially etched to form a contact hole 122 that expose a portion of the substrate 100. Particularly, after a photoresist pattern is formed on the insulation layer 120, the insulation layer 120 is etched by a dry etching process using the photoresist pattern as an etching mask, thereby forming the contact hole 122 through the insulation layer 120. Then, the photoresist pattern is removed from the insulation layer 120 by an ashing process and/or a stripping process.

Figure 7:
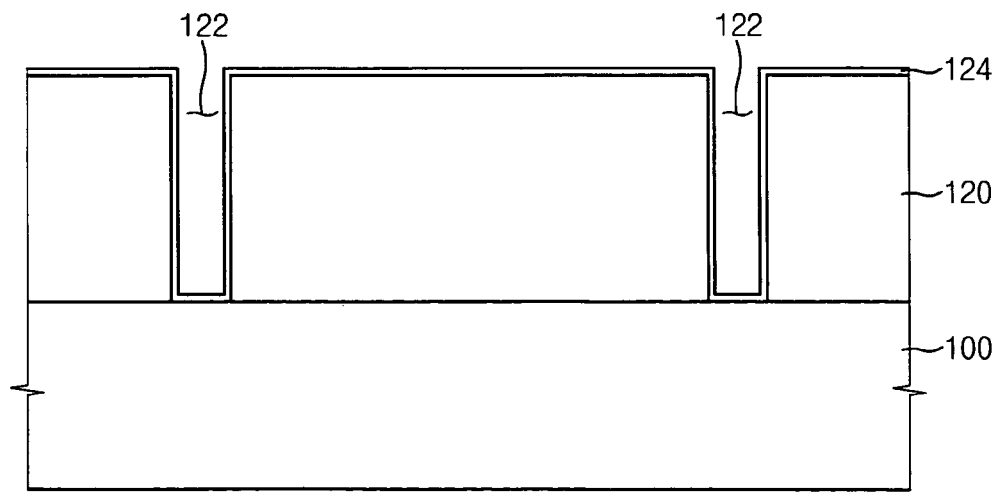

Referring to FIG. 7, a barrier layer 124 is uniformly formed on the exposed portion of the substrate 100, a sidewall of the contact holes 122 and the insulation layer 120. The barrier layer 124 may be formed using titanium (Ti), tantalum (Ta), tungsten (W), titanium nitride (TiN), tantalum nitride (TaN), tungsten nitride (WN), tungsten carbon nitride (WCN), titanium silicon nitride (TiSiN), tungsten silicon nitride (WSiN), etc. These can be used alone or in a mixture thereof.

Figure 8:
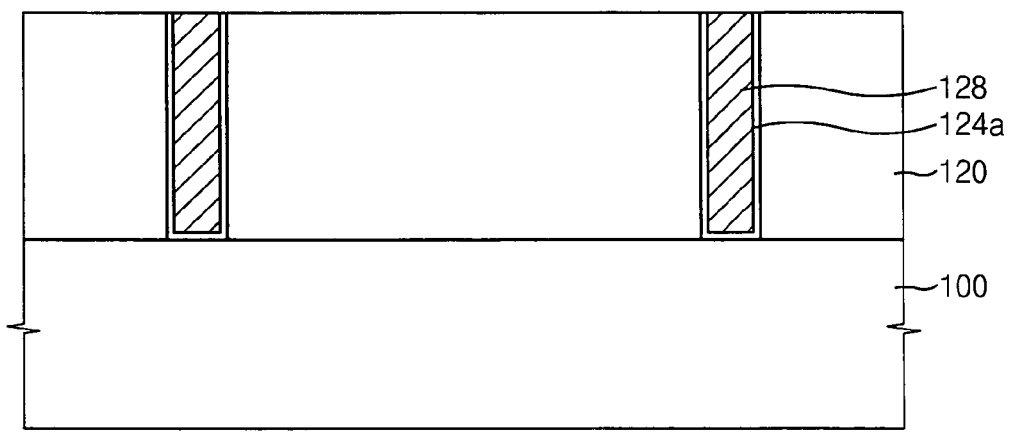

Referring to FIG. 8, a conductive layer is formed on the barrier layer 124 to fill up the contact hole 122. The conductive layer may be formed by a CVD process or a physical vapor deposition (PVD) process using a conductive material such as doped polysilicon, metal or conductive metal nitride.

The conductive layer and the barrier layer 124 are partially removed to form a preliminary barrier layer pattern 124a and a preliminary plug 128 in the contact hole 122. The conductive layer and the barrier layer 124 may be partially removed by a chemical mechanical polishing (CMP) process, an etch back process or a combination process of CMP and etch back.

Figure 9:
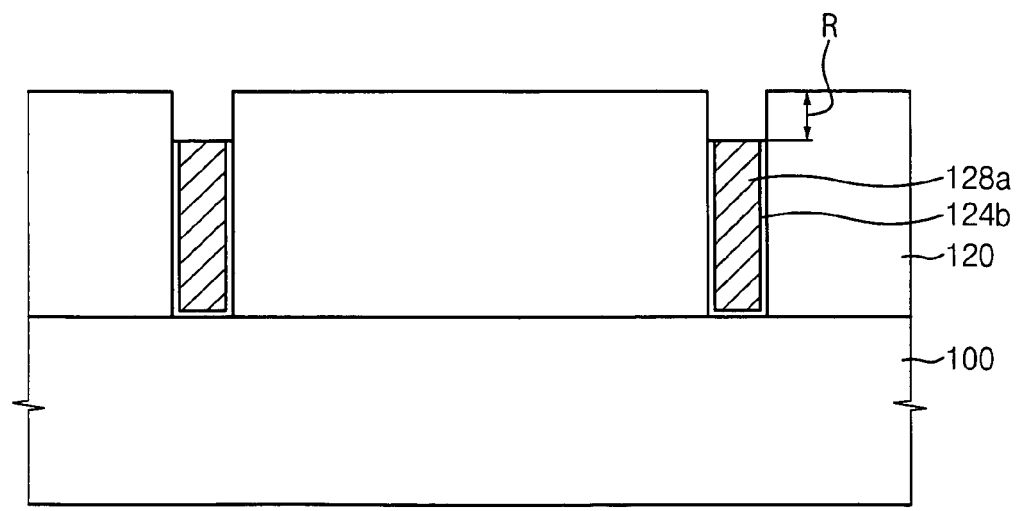

Referring to FIG. 9, an etch back process is performed concerning the preliminary plug 128 and the barrier layer pattern 124a so that a recessed plug 128a and barrier layer pattern 124b remain in the contact hole 122. When the recessed plug 128a is formed in the contact hole 122, a recess having a depth R is formed on the recessed plug 128a. Thus, the recessed plug 128a has a height substantially smaller than a depth of the contact hole 122 by the depth R of the recess. For example, the recessed plug 128a has a height of about 4/5 to about 9/10 of a depth of the contact hole 122. That is, the depth R of the recess is about 1/5 to about 1/10 of an entire depth of the contact hole 122. Preferably, the depth R of the recess is about 1/6 to about 1/8 of the entire depth of the contact hole 122.

Figure 10:
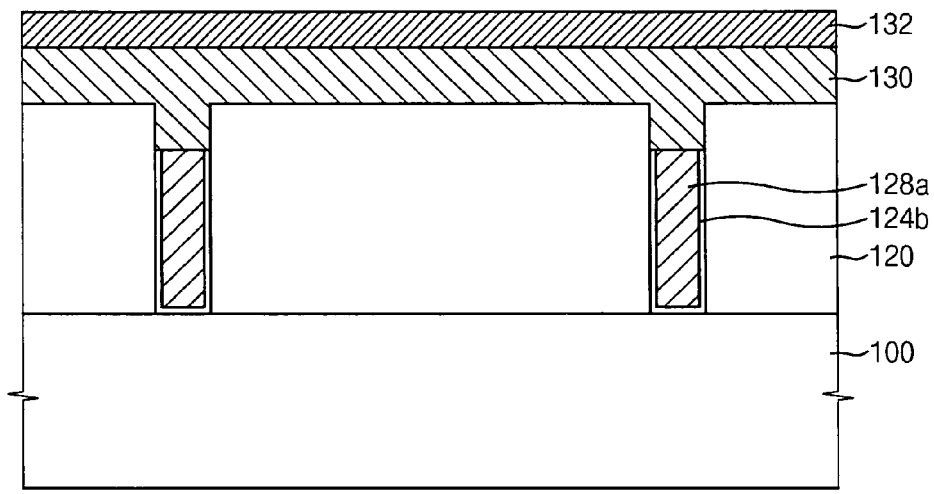

Referring to FIG. 10, a metal layer 130 is formed on the insulation layer 120 to completely fill the contact hole 122. That is, the recess is filled with the metal layer 130. The metal layer 130 may be formed using tungsten, aluminum, copper, etc.

A mask layer 132 is formed on the metal layer 130. The mask layer 132 may be formed using a nitride such as silicon nitride.

Figure 11:
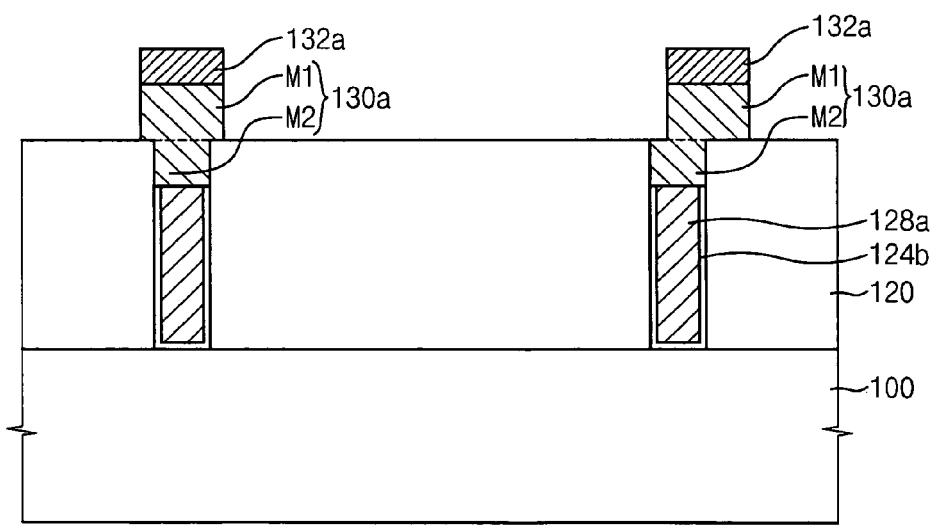

Referring to FIG. 11, after a photoresist pattern is formed on the mask layer 132, the mask layer 132 is partially etched using the photoresist pattern as an etching mask. Hence, an etching mask 132a is formed on the metal layer 130.

The metal layer 130 is partially etched using the etching mask 132a to thereby form a metal wiring structure 130a on the recessed plug 128a and the insulation layer 120. The metal wiring structure 130a includes a lower metal wiring M2 and an upper metal wiring M1. The lower metal wiring M2 completely fills up the recess of the contact hole 122, and the upper metal wiring M1 is formed on the lower metal wiring M2. The upper metal wiring M1 may be alternately formed on the lower metal wiring M2 so that the upper and lower metal wirings are offset by an error factor cause by a misalignment of the etching mask 132a.

In the method of manufacturing a semiconductor device including the metal wiring structure 130a electrically connected to the recessed plug 128a, because the recessed plug 128a is not exposed in the etching process for forming the metal wiring structure 130a, the recessed plug 128a is not damaged despite the alignment error of the etching mask 132a relative to the metal layer 130. Therefore, no contact failure between the recessed plug 128a and the metal wiring structure 130a would occur.

FIGS. 12 to 18 are cross sectional views illustrating a method of manufacturing a semiconductor device including metal wiring structures in accordance with an exemplary embodiment of the present invention.

Figure 12:
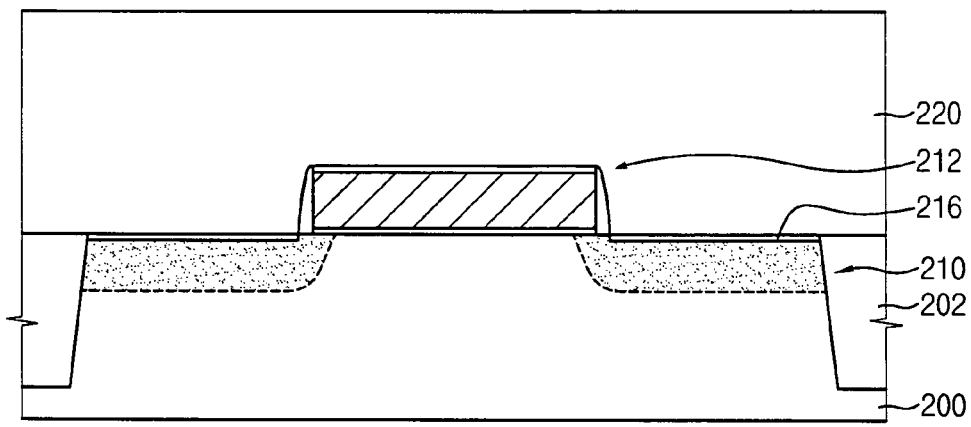
FIGS. 12 to 18 are cross sectional views illustrating a method of manufacturing a semiconductor device including metal wiring structures in accordance with an exemplary embodiment of the present invention.

Referring to FIG. 12, an isolation layer 202 is formed on a substrate 200 to thereby define an active region and a field region on the substrate 200.

A first conductive structure 210 and a second conductive structure 212 are typically formed in the active region of the substrate 200. The first conductive structure 210 includes source/drain regions formed on the substrate 200, and a first metal silicide layer pattern formed on the source/drain regions. The second conductive structure 212 includes a gate insulation layer formed between the source drain regions, a gate electrode formed on the gate insulation layer, a second metal silicide layer pattern formed on the gate electrode, and a spacer formed on a sidewall of the gate electrode.

An insulation layer 220 is formed on the substrate 200 to cover the first and second conductive structures 210 and 212. The insulation layer 220 may be formed using an oxide.

Figure 13:
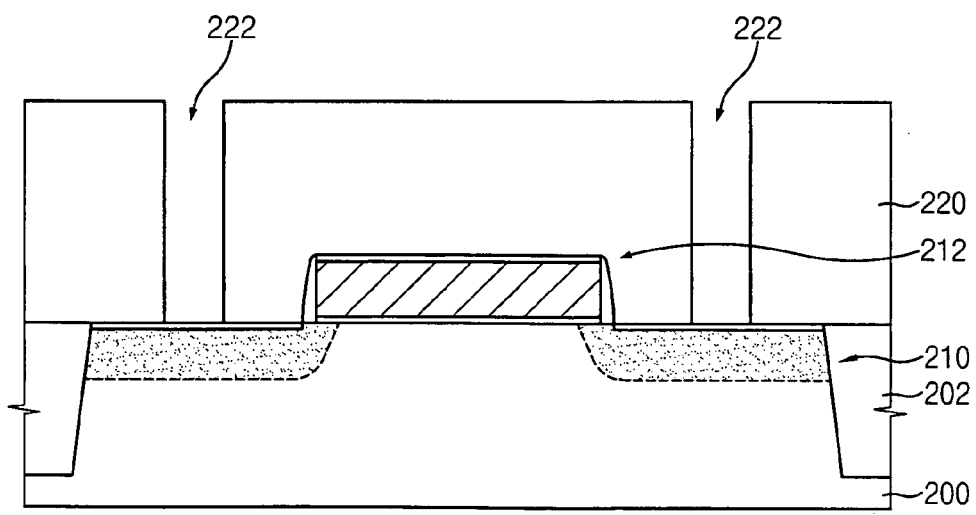

Referring to FIG. 13, after a photoresist pattern is formed on the insulation layer 220, the insulation layer 220 is partially etched using the photoresist pattern as an etching mask. Then, the photoresist pattern is removed from the insulation layer 220 by an ashing process and/or a stripping process. Thus, a first contact hole 222 exposing the first conductive structure 210 is formed through the insulation layer 220.

Figure 14:
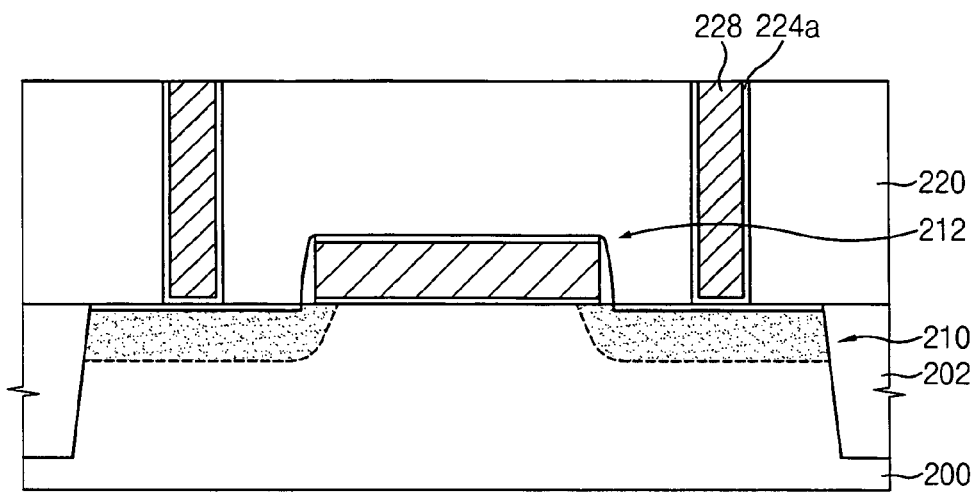

Referring to FIG. 14, a first barrier layer is formed on the exposed first conductive structure 210, a sidewall of the first contact hole 222 and the insulation layer 220. The first barrier layer may be formed using titanium, tantalum, tungsten, titanium nitride, tantalum nitride, tungsten nitride, tungsten carbon nitride, titanium silicon nitride, tungsten silicon nitride, etc. These can be used alone or in a mixture thereof.

A conductive layer is formed on the first barrier layer to fill up the first contact hole 222. The conductive layer may be formed using doped polysilicon or metal.

The conductive layer and the first barrier layer are partially removed by a CMP process, an etch back process or a combination process of CMP and etch back until the insulation layer 220 is exposed, thereby forming a first preliminary barrier layer pattern 224a and a preliminary plug 228 in the first contact hole 222.

Figure 15:
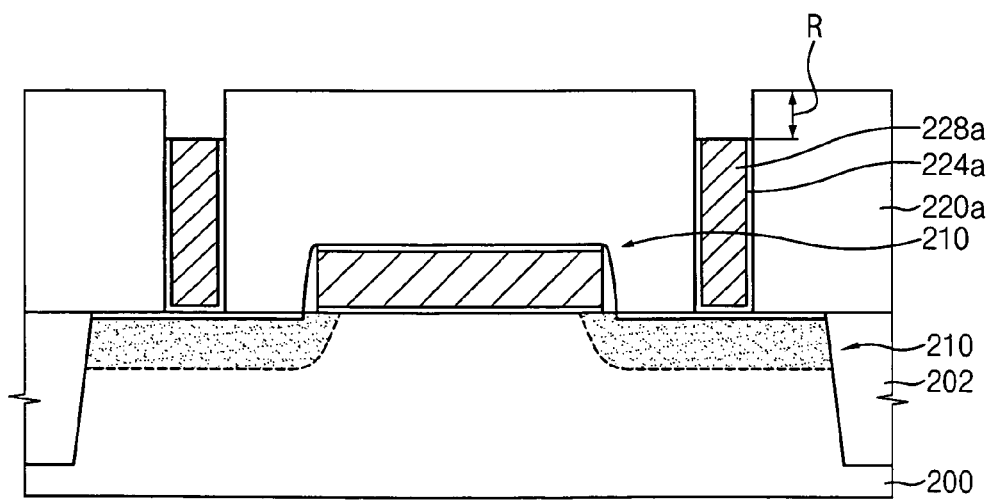

Referring to FIG. 15, upper portions of the preliminary plug 228 and the first preliminary barrier layer pattern 224a are removed by an etch back process so that a recess having a depth R is formed at an upper portion of the first contact hole 222. Therefore, a recessed plug 228a and a first barrier layer pattern 224b are formed in the first contact hole 222. A height of the removed portion of the preliminary plug 228 may be about 1/5 to about 1/10 of an entire height of the preliminary plug 228. Hence, the recessed plug 228a has a height that is smaller (smaller by about ⅒ to about ⅕) than a depth of the first contact hole 222.

Figure 16:
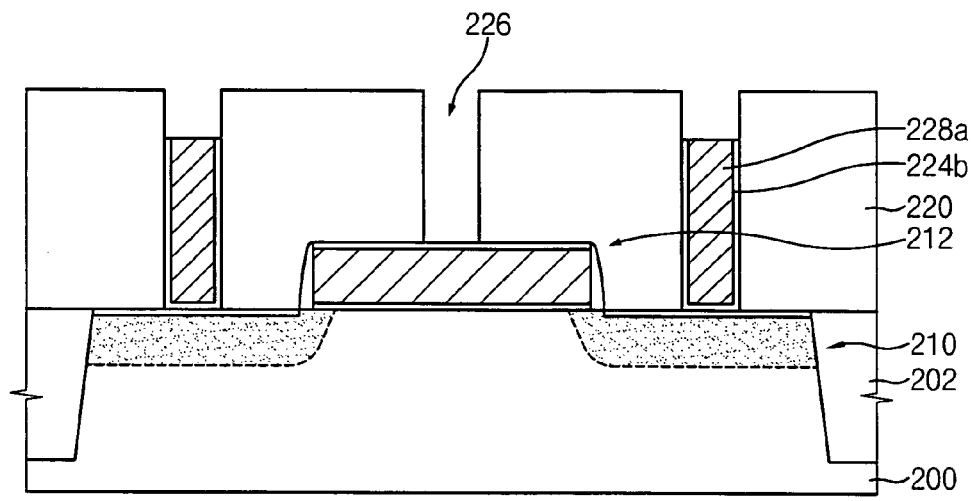

Referring to FIG. 16, the insulation layer 220 is partially etched to thereby form a second contact hole 226 that exposes the second conductive structure 212. A process of forming the second contact hole 226 is substantially identical to the above-described process of forming the first contact hole 222.

Figure 17:
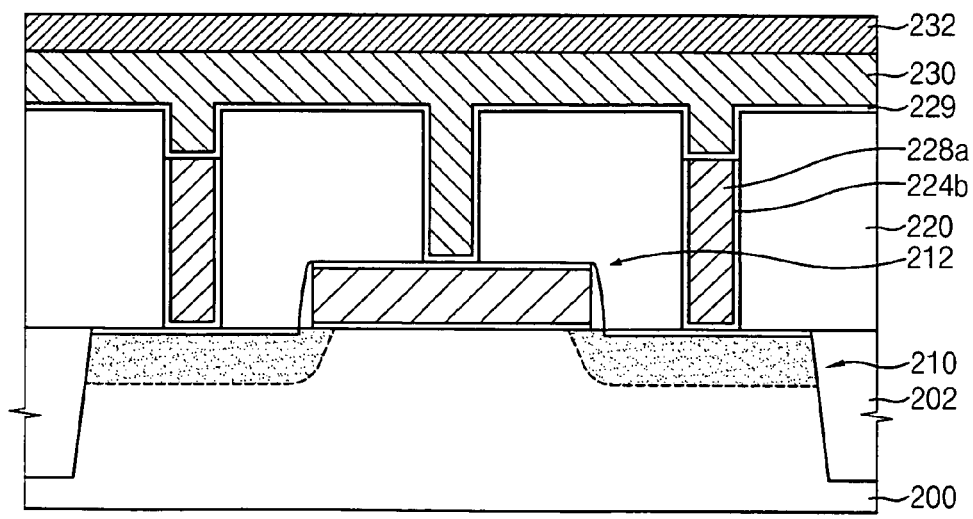

Referring to FIG. 17, a second barrier layer 229 is formed on the exposed second conductive structure 212, a sidewall of the second contact hole 226 and the insulation layer 220. The second barrier layer 229 is additionally formed on the recessed plug 228a and a sidewall of the recess of the first contact hole 210. The second barrier layer 229 may be formed using titanium, tantalum, tungsten, titanium nitride, tantalum nitride, tungsten nitride, tungsten carbon nitride, titanium silicon nitride, tungsten silicon nitride, etc. These can be used alone or in a mixture thereof.

A metal layer 230 is formed on the second barrier layer 229 to fill up the second contact hole 226 and the recess of the first contact hole 222. The metal layer 230 may be formed using tungsten, aluminum, copper, etc.

A mask layer 232 is formed on the metal layer 230. The mask layer 232 may be formed using a nitride such as silicon nitride.

Figure 18:
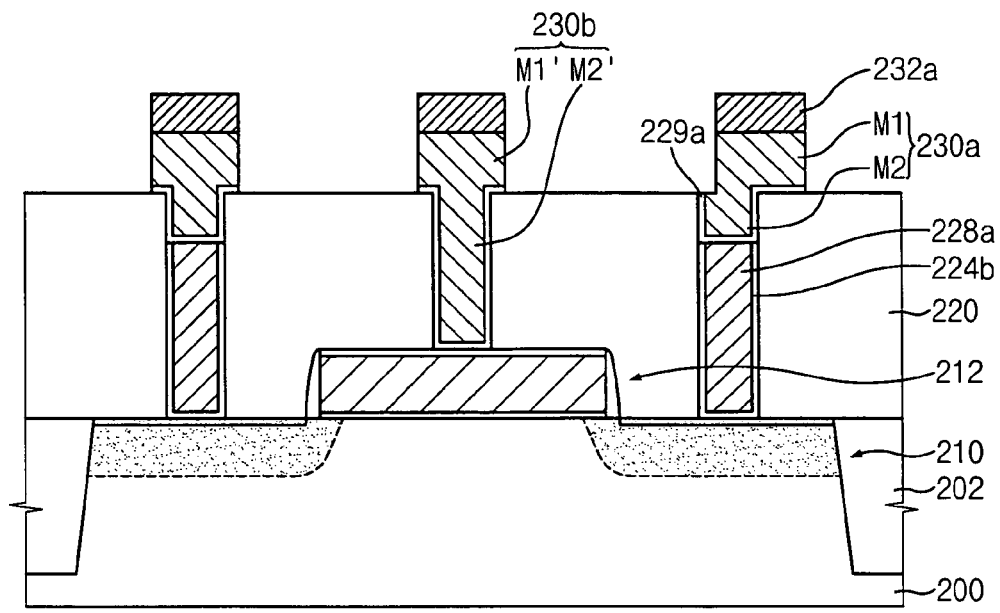

Referring to FIG. 18, after photoresist pattern is formed on the mask layer 232, the mask layer 232 is patterned using the photoresist pattern as an etching mask so that an etching mask 232a is formed on the metal layer 230. Then, the photoresist pattern is removed from the etching mask 232a by an ashing process and/or a stripping process.

The metal layer 230 is partially etched using the etching mask 232a to form a first metal wiring structure 230a and a second metal wiring structure 230b. Simultaneously, second barrier layer patterns are formed between the second metal wiring structure 230b and a sidewall of the second contact hole 226, and between the recessed plug 228a and the first metal wiring structure 230a. The first metal wiring structure 230a includes a first lower metal wiring M2 formed on the recessed plug 228a to fill up the recess of the first contact hole 222, and a first upper wiring M1 formed on the first lower metal wiring M2 and insulation layer 220. The first upper metal wiring M1 may be alternately formed on the first lower metal wiring M2. Here, one of the second barrier layer patterns is formed between the first lower metal wiring M2 and the recessed plug 228a, and between the first upper metal wiring M1 and the insulation layer 220. The second metal wiring structure 330b includes a second lower metal wiring M2' formed on the other of the second barrier layer patterns to fill up the second contact hole 226, and a second upper metal wiring M1' formed on the second lower metal wiring M2'. The other of the second barrier layer patterns is positioned between the second lower metal wiring M2' and a sidewall of the second contact hole 226, and between the second lower metal wiring M2' and the second conductive structure 212. The other of the second barrier layer patterns may be additionally formed between the insulation layer 220 and the second upper metal wiring M1'.

By using this method of manufacturing a semiconductor device having first and second metal wiring structures 230a and 230b, although an alignment error of the etching mask 232a relative to the recessed plug 228a occurs, the recessed plug 228a is not damaged in the etching process when forming the first and second metal wiring structures 230a and 230b because the recessed plug 228a is not exposed in the etching process. Therefore, no contact failure occurs between the recessed plug 228a relative to the first metal wiring structure 230a.

FIGS. 19 to 24 are cross sectional views illustrating a method for manufacturing a semiconductor device including metal wiring structures in accordance with an exemplary embodiment of the present invention.

Figure 19:
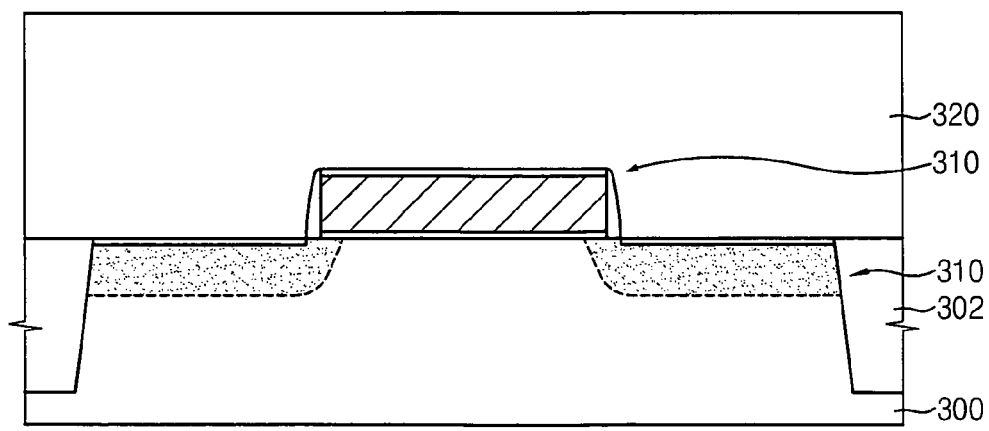
FIGS. 19 to 24 are cross sectional views illustrating a method of manufacturing a semiconductor device including metal wiring structures in accordance with an exemplary embodiment of the present invention.

Referring to FIG. 19, an isolation layer 302 is formed on a substrate 300 by an STI process to thereby define an active region and a field region of the substrate 300.

A first conductive structure 310 and a second conductive structure 312 are typically formed in the active region of the substrate 300. The first conductive structure 310 includes source/drain regions formed on the substrate 300, and a first metal silicide layer pattern formed on the source/drain regions. The second conductive structure 312 includes a gate insulation layer formed between the source drain regions, a gate electrode formed on the gate insulation layer, a second metal silicide layer pattern formed on the gate electrode, and a spacer formed on a sidewall of the gate electrode.

An insulation layer 320 is formed on the substrate 300 to cover the first and second conductive structures 310 and 312. The insulation layer 320 may be formed using an oxide.

Figure 20:
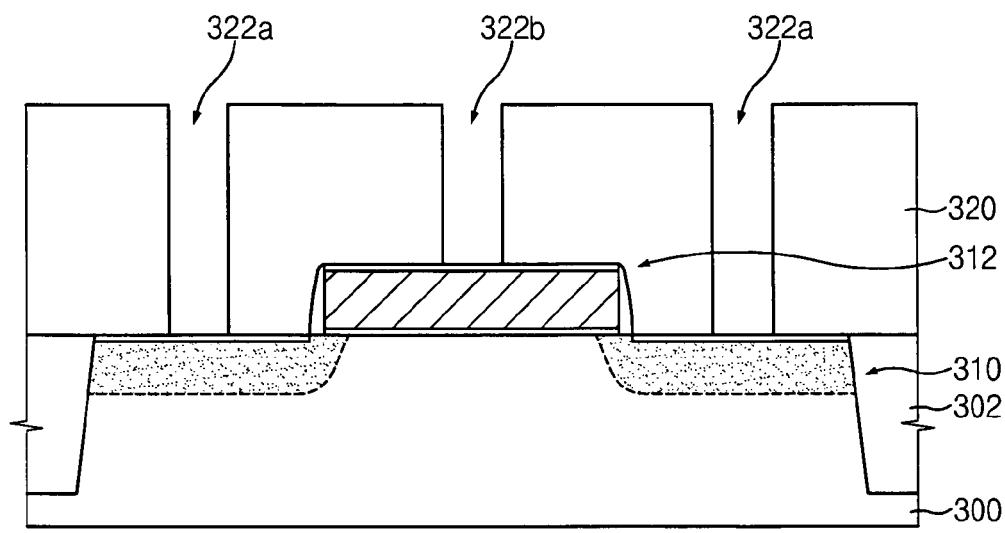

Referring to FIG. 20, after a photoresist pattern is formed on the insulation layer 320, the insulation layer 320 is partially etched using the photoresist pattern as an etching mask. After the photoresist pattern is removed from the insulation layer 320 by an ashing process and/or a stripping process, a first contact hole 322a and a second contact hole 322b are simultaneously formed through the insulation layer 320. The first contact hole 322a exposes the first conductive structure 310, and the second contact hole 322b exposes the second conductive structure 312.

Figure 21:
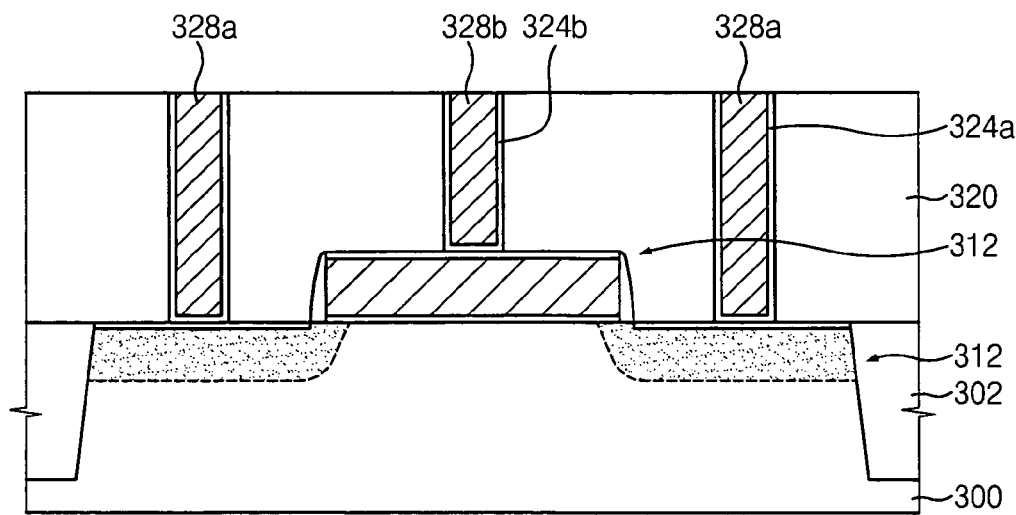

Referring to FIG. 21, a barrier layer is formed on the exposed first conductive structure 310, the exposed second conductive structure 312, a sidewall of the first contact hole 322a, a sidewall of the second contact hole 322b and the insulation layer 320. The barrier layer may be formed using titanium, tantalum, tungsten, titanium nitride, tantalum nitride, tungsten nitride, tungsten carbon nitride, titanium silicon nitride, tungsten silicon nitride, etc. These can be used alone or in a mixture thereof.

A conductive layer is formed on the barrier layer to fill up the first contact hole 322a and the second contact hole 322b. The conductive layer may be formed using doped polysilicon or metal.

The conductive layer and the barrier layer are partially removed by a CMP process, an etch back process or a combination process of CMP and etch back until the insulation layer 320 is exposed, thereby forming a first preliminary barrier layer pattern 324a, a second first preliminary barrier layer 324b, a first preliminary plug 328a, and a second preliminary plug 328b. The first preliminary barrier layer pattern 324a is formed on the exposed first conductive structure 310 and the sidewall of the first contact hole 322a. The first preliminary plug 328a is formed on the first preliminary barrier layer pattern 324a. The second preliminary barrier layer pattern 324b is formed on the exposed second conductive structure 312 and the sidewall of the second contact hole 322b. The second preliminary plug 328b is formed on the second preliminary barrier layer pattern 324b.

Figure 22:
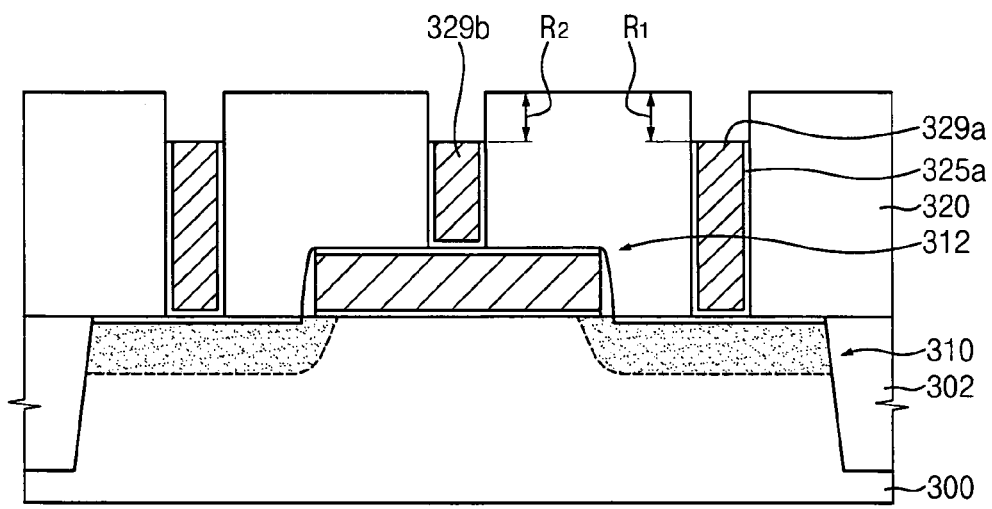

Referring to FIG. 22, upper portions of the first and second preliminary plugs 328a and 328b and upper portions of the first and second preliminary barrier layer patterns 324a and 324b are removed by an etch back process so that a first recess having a first depth R1 and a second recess having a second depth R2 are formed at upper portions of the first contact hole 322a and the second contact hole 322b, respectively. Therefore, a first recessed plug 329a and a first barrier layer pattern 325a are formed in the first contact hole 322a, and also a second recessed plug 329b and a second barrier layer pattern 325b are formed in the second contact hole 322b. Heights of the removed portions of the first and second preliminary plugs 328a and 328b are preferably about ⅕ to about 1/10 of entire heights of the first and second preliminary plugs 328a and 328b and more preferably between ⅕ and ⅙. Thus, the first and second recessed plug 329a and 329b have heights about ⅘ to about 9/10 of the depths of the first and second contact holes 322a and 322b, respectively.

Figure 23:
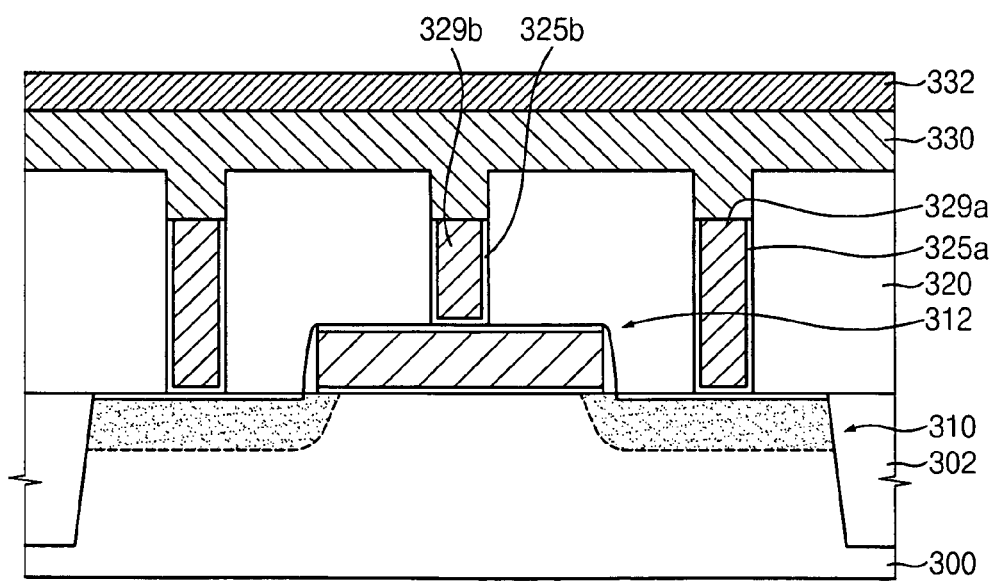

Referring to FIG. 23, a metal layer 330 is formed on the insulation layer 320 to fill up the first recess of the first contact hole 322a and the second recess of the second contact hole 322b. The metal layer 330 may be formed using tungsten, aluminum, copper, etc.

A mask layer 332 is formed on the metal layer 330. The mask layer 332 may be formed using a nitride such as silicon nitride.

Figure 24:
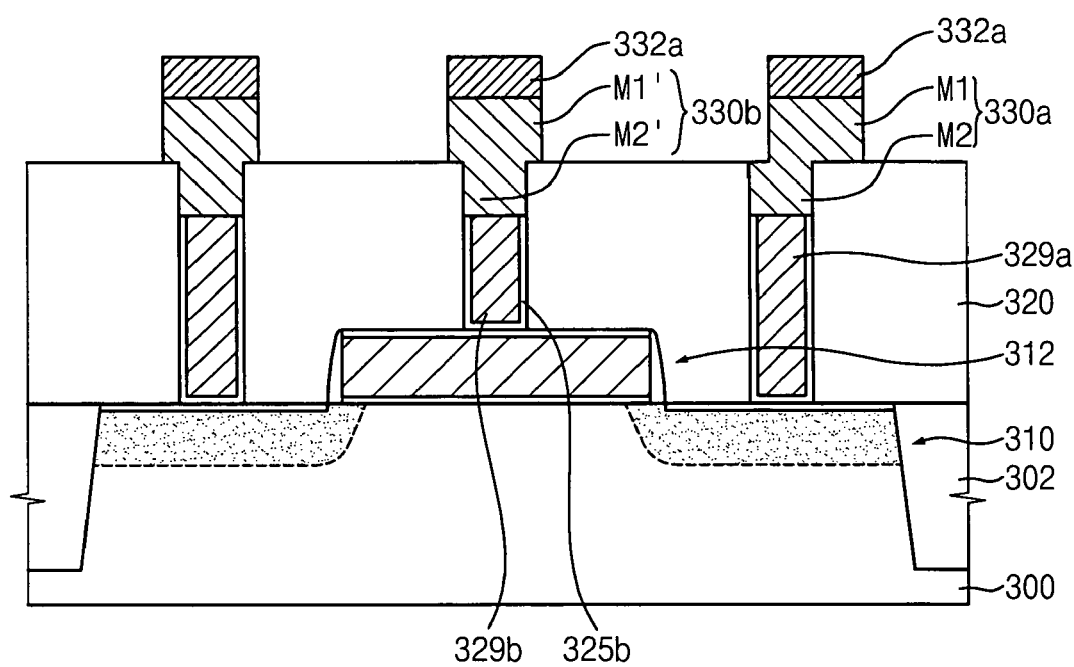

Referring to FIG. 24, after photoresist pattern is formed on the mask layer 332, the mask layer 332 is patterned using the photoresist pattern as an etching mask so that an etching mask 332a is formed on the metal layer 330. Then, the photoresist pattern is removed from the etching mask 332a by an ashing process and/or a stripping process.

The metal layer 330 is partially etched using the etching mask 332a to form a first metal wiring structure 330a and a second metal wiring structure 330b. The first metal wiring structure 330a includes a first lower metal wiring M2 formed on the first recessed plug 329a to fill up the first recess of the first contact hole 322a, and a first upper wiring M1 formed on the first lower metal wiring M2 and insulation layer 320. The first upper metal wiring M1 may be alternately formed on the first lower metal wiring M2. The second metal wiring structure 330b includes a second lower metal wiring M2' formed on the second recessed plug 329b to fill up the second recess of the contact hole 322b, and a second upper metal wiring M1' formed on the second lower metal wiring M2'.

By using this method of manufacturing a semiconductor device having first and second metal wiring structures 330a and 330b, although alignment errors of the etching mask 332a relative to the first and second recessed plugs 329a and 329b occur, the first and second recessed plugs 229a and 229b are not damaged in the etching process for forming the first and second metal wiring structures 330a and 330b because the first and second recessed plugs 329a and 329b are not exposed in the etching process. Therefore, contact failures occur between the first and second recessed plugs 329a and 329b relative to the first and second metal wiring structures 330a and 330b, respectively.

According to the present invention, a recessed plug is formed in a contact hole by partially etching a preliminary plug, and then a metal wiring structure is formed on the recessed plug. A lower portion of the metal wiring structure prevents damage to the recessed plug in an etching process for forming the metal wiring structure. Therefore, the recessed plug may be formed without damage thereof even in the case of an alignment error between an etching mask and the recessed plug during the etching process for forming the metal wiring structure. As a result, no contact failure occurs between the metal wiring structure relative to the recessed plug.

Having described the exemplary embodiments of the present invention, it is noted that modifications and variations may be made by persons skilled in the art in light of the above teachings. It is therefore to be understood that changes may be made in the particular embodiment of the present invention disclosed which is within the scope and the spirit of the invention outlined by the appended claims.

What is claimed is:

1. A semiconductor device comprising:
    an insulation layer formed on a substrate, the insulation layer having a contact hole exposing a portion of the substrate;
    a recessed contact plug partially filling up the contact hole, the recessed contact plug having a height substantially smaller than a depth of the contact hole; and
    a metal wiring structure having a lower metal wiring contacting the recessed plug, and an upper metal wiring formed on the lower metal wiring, wherein the upper metal wiring is offset relative to the lower metal wiring.

2. The semiconductor device of claim 1, further comprising a conductive structure including a gate electrode formed on the substrate and source/drain regions formed adjacent to the gate electrode.

3. The semiconductor device of claim 2, wherein the conductive structure further comprises metal silicide layer patterns formed on the gate electrode and the source/drain regions, respectively.

4. The semiconductor device of claim 1, further comprising a barrier layer pattern formed between the recessed plug and a sidewall of the contact hole and between the recessed plug and the exposed portion of the substrate.

5. The semiconductor device of claim 1, wherein the height of the recessed plug is about ⅘ to about 9/10 of the depth of the contact hole.

6. A semiconductor device comprising:
    a first conductive structure and a second conductive structure formed on a substrate;
    an insulation layer formed on a substrate, the insulation layer having a first contact hole exposing the first conductive structure, and a second contact hole exposing the second conductive structure;
    a recessed contact plug partially filling up the first contact hole, the recessed contact plug having a height substantially smaller than a depth of the first contact hole;
    a first metal wiring structure formed on the insulation layer to make contact with the recessed plug; and
    a second metal wiring structure formed on the insulation layer to make direct contact with the second conductive structure.

7. The semiconductor device of claim 6, wherein the first conductive structure comprises source/drain regions and a first metal silicide layer pattern formed on the source/drain regions, and the second conductive structure comprises a gate electrode formed between the source/drain regions and a second metal silicide layer pattern formed on the gate electrode.

8. The semiconductor device of claim 6, further comprising:
    a first barrier layer pattern formed between the recessed plug and a sidewall of the first contact hole, and between the recessed plug and the first conductive structure; and
    a second barrier layer pattern formed between the second metal wiring structure and a sidewall of the second contact hole, and between the second metal wiring structure and the second eonductive structure.

9. The semiconductor device of claim 6, wherein the height of the recessed plug is about ⅘ to about 9/10 of the depth of the first contact hole.

10. A semiconductor device comprising:
- an insulation layer formed on a substrate, the insulation layer having a contact hole exposing a portion of the substrate;
- a recessed contact plug partially filling up the contact hole, the recessed contact plug having a height substantially smaller than a depth of the contact hole; and
- a unitary metal wiring structure having a lower metal portion contacting the recessed plug and filling a remaining portion of the contact hole, and an upper metal portion extending above the insulation layer.

11. The semiconductor device of claim 10, wherein the upper metal structure is offset relative to the lower metal structure so that a structure center of the upper metal structure is offset relative to a structure center of the recessed contact plug.

12. The semiconductor device of claim 10, further comprising a conductive structure including a gate electrode formed on the substrate and source/drain regions formed adjacent to the gate electrode.

13. The semiconductor device of claim 12, wherein the conductive structure further comprises metal silicide layer patterns formed on the gate electrode and the source/drain regions, respectively.

14. The semiconductor device of claim 10, further comprising a barrier layer pattern formed between the recessed plug and a sidewall of the contact hole and between the recessed plug and the exposed portion of the substrate.

15. The semiconductor device of claim 10, wherein the height of the recessed plug is about ⅘ to about 9/10 of the depth of the contact hole.

* * * * *

UNITED STATES PATENT AND TRADEMARK OFFICE
CERTIFICATE OF CORRECTION

| | | |
|---|---|---|
| PATENT NO. | : 7,348,676 B2 | Page 1 of 1 |
| APPLICATION NO. | : 11/149600 | |
| DATED | : March 25, 2008 | |
| INVENTOR(S) | : Seong-Soo Lee | |

It is certified that error appears in the above-identified patent and that said Letters Patent is hereby corrected as shown below:

Column 14, line 67, the word "eonductive" should read -- conductive --.

Signed and Sealed this

Twenty-eighth Day of October, 2008

JON W. DUDAS
*Director of the United States Patent and Trademark Office*